(12) United States Patent
Middlebrooks et al.

(10) Patent No.: US 10,331,041 B2
(45) Date of Patent: Jun. 25, 2019

(54) METROLOGY METHOD AND APPARATUS, LITHOGRAPHIC SYSTEM AND DEVICE MANUFACTURING METHOD

(71) Applicant: ASML Netherlands B.V., Veldhoven (NL)

(72) Inventors: Scott Anderson Middlebrooks, Veldhoven (NL); Niels Geypen, Veldhoven (NL); Hendrik Jan Hidde Smilde, Veldhoven (NL); Alexander Straaijer, Veldhoven (NL); Maurits Van Der Schaar, Veldhoven (NL); Markus Gerardus Martinus Maria Van Kraaij, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/159,884

(22) Filed: Oct. 15, 2018

(65) Prior Publication Data

US 2019/0049860 A1    Feb. 14, 2019

Related U.S. Application Data

(63) Continuation of application No. 15/912,036, filed on Mar. 5, 2018, now Pat. No. 10,126,662, which is a
(Continued)

(51) Int. Cl.
*G03F 7/20* (2006.01)

(52) U.S. Cl.
CPC ................. *G03F 7/70633* (2013.01)

(58) Field of Classification Search
CPC ........ G01B 11/26; G01B 11/272; G01B 5/24; G03F 7/70633; G03F 1/42; G03F 1/84;
(Continued)

(56) References Cited

U.S. PATENT DOCUMENTS

| 9,158,194 B2 | 10/2015 | Koolen et al. |
| 9,910,366 B2 | 3/2018 | Middlebrooks et al. |

(Continued)

FOREIGN PATENT DOCUMENTS

| JP | 2012-169617 A | 9/2012 |
| JP | 2013-051412 A | 3/2013 |

(Continued)

OTHER PUBLICATIONS

International Search Report and Written Opinion directed to related International Patent Application No. PCT/EP2014/065461, dated Dec. 2, 2015; 9 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

Disclosed is a method of measuring a parameter of a lithographic process, and associated inspection apparatus. The method comprises measuring at least two target structures on a substrate using a plurality of different illumination conditions, the target structures having deliberate overlay biases; to obtain for each target structure an asymmetry measurement representing an overall asymmetry that includes contributions due to (i) the deliberate overlay biases, (ii) an overlay error during forming of the target structure and (iii) any feature asymmetry. A regression analysis is performed on the asymmetry measurement data by fitting a linear regression model to a planar representation of asymmetry measurements for one target structure against asymmetry measurements for another target structure, the linear regression model not necessarily being fitted through an origin of the planar representation. The overlay error can then be determined from a gradient described by the linear regression model.

12 Claims, 10 Drawing Sheets

Related U.S. Application Data continuation of application No. 14/906,896, filed as application No. PCT/EP2014/065461 on Jul. 18, 2014, now Pat. No. 9,910,366.

(60) Provisional application No. 61/975,312, filed on Apr. 4, 2014, provisional application No. 61/863,150, filed on Aug. 7, 2013.

(58) Field of Classification Search
CPC ...... G03F 7/70683; G03F 7/20; G03F 9/7015; H01L 2223/54426
See application file for complete search history.

(56) References Cited

U.S. PATENT DOCUMENTS

| 10,126,662 | B2 | 11/2018 | Middlebrooks et al. |
|---|---|---|---|
| 2011/0027704 | A1 | 2/2011 | Cramer et al. |
| 2011/0032535 | A1 | 2/2011 | Liesener et al. |
| 2011/0043791 | A1 | 2/2011 | Smilde et al. |
| 2011/0255066 | A1 | 10/2011 | Fuchs et al. |
| 2012/0123581 | A1 | 5/2012 | Smilde et al. |
| 2012/0206703 | A1 | 8/2012 | Bhattacharyya et al. |
| 2013/0054186 | A1 | 2/2013 | Den Boef |
| 2013/0208279 | A1 | 8/2013 | Smith |
| 2016/0161864 | A1 | 6/2016 | Middlebrooks et al. |
| 2018/0196357 | A1 | 7/2018 | Middlebrooks et al. |

FOREIGN PATENT DOCUMENTS

| KR | 10-2012-0058572 A | 6/2012 |
|---|---|---|
| WO | WO 2009/078708 A1 | 6/2009 |
| WO | WO 2009/106279 A1 | 9/2009 |
| WO | WO 2011/012624 A1 | 2/2011 |
| WO | WO 2011/032535 A1 | 3/2011 |
| WO | WO 2012/062858 A1 | 5/2012 |
| WO | WO 2013/143814 A1 | 10/2013 |
| WO | WO 2014/005828 A1 | 1/2014 |

OTHER PUBLICATIONS

International Preliminary Report on Patentability directed to related International Patent Application No. PCT/EP2014/065461, dated Sep. 2, 2016; 7 pages.

Non-Final Office Action for U.S. Appl. No. 14/906,896, dated Jan. 23, 2017; 11 pages.

Final Office Action for U.S. Appl. No. 14/906,896, dated Jul. 18, 2017; 20 pages.

Notice of Allowance for U.S. Appl. No. 14/906,896, dated Oct. 18, 2017; 11 pages.

Notice of Allowance for U.S. Appl. No. 15/912,036, dated Jun. 29, 2018; 10 pages.

METROLOGY METHOD AND APPARATUS, LITHOGRAPHIC SYSTEM AND DEVICE MANUFACTURING METHOD

CROSS-REFERENCE TO RELATED APPLICATIONS

This application claims the benefit of U.S. patent application Ser. No. 15/912,036, filed Mar. 5, 2018, U.S. patent application Ser. No. 14/906,896, 371(c) Date Jan. 21, 2016, Intl. Application No PCT/EP2014/065461, filed Jul. 18, 2014, U.S. Provisional Application 61/863,150, which was filed on Aug. 7, 2013 and U.S. Provisional Application 61/975,312, which was filed on Apr. 4, 2014, which are all incorporated herein in their entirety by reference.

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) While synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by sorrel scatterometers are relatively large gratings, e.g., 40 µm by 40 µm, and the measurement beam generates a spot that is smaller than the grating the grating is underfilled). This simplifies mathematical reconstruction of the target as it can be regarded as infinite. However, in order to reduce the size of the targets, e.g., to 10 µm by 10 µm or less, so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Diffraction-based overlay using dark-field detection of the diffraction orders enables overlay measurements on smaller targets. These targets can be smaller than the illumination spot and may be surrounded by product structures on a wafer. Multiple targets can be measured in one image.

In the known metrology technique, overlay measurement results are obtained by measuring the target twice under certain conditions, while either rotating the target or changing the illumination mode or imaging mode to obtain separately the −1st and the ±1st diffraction order intensities. Comparing these intensities for a given grating provides a measurement of asymmetry in the grating, and asymmetry in an overlay grating can be used as an indicator of overlay error.

Although the known dark-field image-based overlay measurements are fast and computationally very simple (once calibrated), they rely on an assumption that overlay is the only cause of asymmetry in the target structure. Any other asymmetry in the stack, such as asymmetry of features within one or both of the overlaid gratings, also causes an asymmetry in the 1st orders. This feature asymmetry which is not related to the overlay clearly perturbs the overlay measurement, giving an inaccurate overlay result. Feature asymmetry in the bottom grating of the overlay grating is a common form of feature asymmetry. It may originate, for example, in wafer processing steps such as chemical-mechanical polishing (CMP), performed after the bottom grating was originally formed.

Accordingly the skilled person has to choose between, on the one hand, a simple and fast measurement process that provides overlay measurements but is subject to inaccuracies when other causes of asymmetry are present, or, on the other hand, more traditional techniques that are computationally intensive and typically require several measurements of large, underfilled gratings to avoid the pupil image being polluted with signal contribution from the overlay grating environment, which hampers the reconstruction based on this pupil image.

SUMMARY

Therefore, it is desired to make overlay measurements more robust to feature asymmetry contributions to target structure asymmetry and/or distinguish the contributions to target structure asymmetry that are caused by feature asymmetry from those caused by overlay (including bias).

A first aspect provides a method of measuring a parameter of a lithographic process, the method comprising the steps of: (a) illuminating target structures on a substrate, the target structures comprising at least a first target structure comprising an overlaid periodic structure having a first deliberate overlay bias and a second target structure comprising an overlaid periodic structure having a second deliberate overlay bias; and detecting radiation scattered by each target structure to obtain for each target structure an asymmetry measurement representing an overall asymmetry that includes contributions due to (i) the deliberate overlay bias in the target structure, (ii) an overlay error in a lithographic process during forming of the target structure and (iii) feature asymmetry within one or more of the periodic structures; (b) repeating step (a) for a plurality of different illumination conditions; (c) performing a regression analysis on asymmetry measurement data obtained in step (b) by fitting a linear regression model to a planar representation of asymmetry measurements for the first target structure against asymmetry measurements for the second target structure, the linear regression model not necessarily being fitted through an origin of the planar representation; and (d) determining the overlay error from a gradient described by the linear regression model.

Another aspect provides an inspection apparatus for measuring a parameter of a lithographic process, the apparatus comprising: a support for a substrate having a plurality of target structures thereon, the target structures comprising at least a first target structure comprising an overlaid periodic structure having a first deliberate overlay bias and a second target structure comprising an overlaid periodic structure having a second deliberate overlay bias; an optical system being operable to illuminate the targets and detecting radiation scattered by each target to obtain for each target structure and for a plurality of different illumination conditions, an asymmetry measurement representing an overall asymmetry that includes contributions due to (i) the deliberate overlay bias in the target structure, (ii) an overlay error in a lithographic process during forming of the target structure and (iii) feature asymmetry within one or more of the periodic structures; a processor arranged to: perform a regression analysis on asymmetry measurement data by fitting a linear regression model to a planar representation of asymmetry measurements for the first target structure against asymmetry measurements for the second target structure, the linear regression model not necessarily being fitted through an origin of the planar representation; and determine the overlay error from a gradient described by the linear regression model.

Yet another aspect further provides a computer program product comprising machine-readable instructions for causing a processor to perform the processing steps (c) and (d) of a method according to the first aspect as set forth above, on asymmetry data obtained by illuminating target structures on a substrate, under a plurality of different illumination conditions, the target structures comprising at least a first target structure comprising an overlaid periodic structure having a first deliberate overlay bias and a second target structure comprising an overlaid periodic structure having a second deliberate overlay bias; and detecting radiation scattered by each target structure to obtain for each target structure an asymmetry measurement representing an overall asymmetry that includes contributions due to (i) the deliberate overlay bias in the target structure, (ii) an overlay error in a lithographic process during forming of the target structure and (iii) feature asymmetry within one or more of the periodic structures.

Yet another aspect further provides a lithographic apparatus comprising the inspection apparatus as set forth above, being operable to apply a device pattern to a series of substrates using a lithographic process, apply target structures to one or more of the series of substrates; measure an overlay parameter of the target structure using a method according to the first aspect as set forth above; and control the lithographic process for later substrates in accordance with the result of the method of measuring a parameter.

A still further aspect provides a method of manufacturing devices wherein a device pattern is applied to a series of substrates using a lithographic process, the method including inspecting at least one periodic structure formed as part of or beside the device pattern on at least one of the substrates using a method according to the first aspect as set forth above and controlling the lithographic process for later substrates in accordance with the result of the inspection method.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 14(a) and 14(b) show representations of uncorrected overlay measurements performed over a wafer using, respectively, TE radiation and TM radiation;

FIG. 14(c) shows the differences between the measurements of FIGS. 14(a) and 14(b);

FIGS. 14(d) and 14(e) show representations of overlay measurements performed over a wafer using, respectively, TE radiation and TM radiation and which have been corrected in accordance with an embodiment of the invention;

FIG. 14(f) shows the differences between the measurements of FIGS. 14(d) and 14(e).

Figure 1:
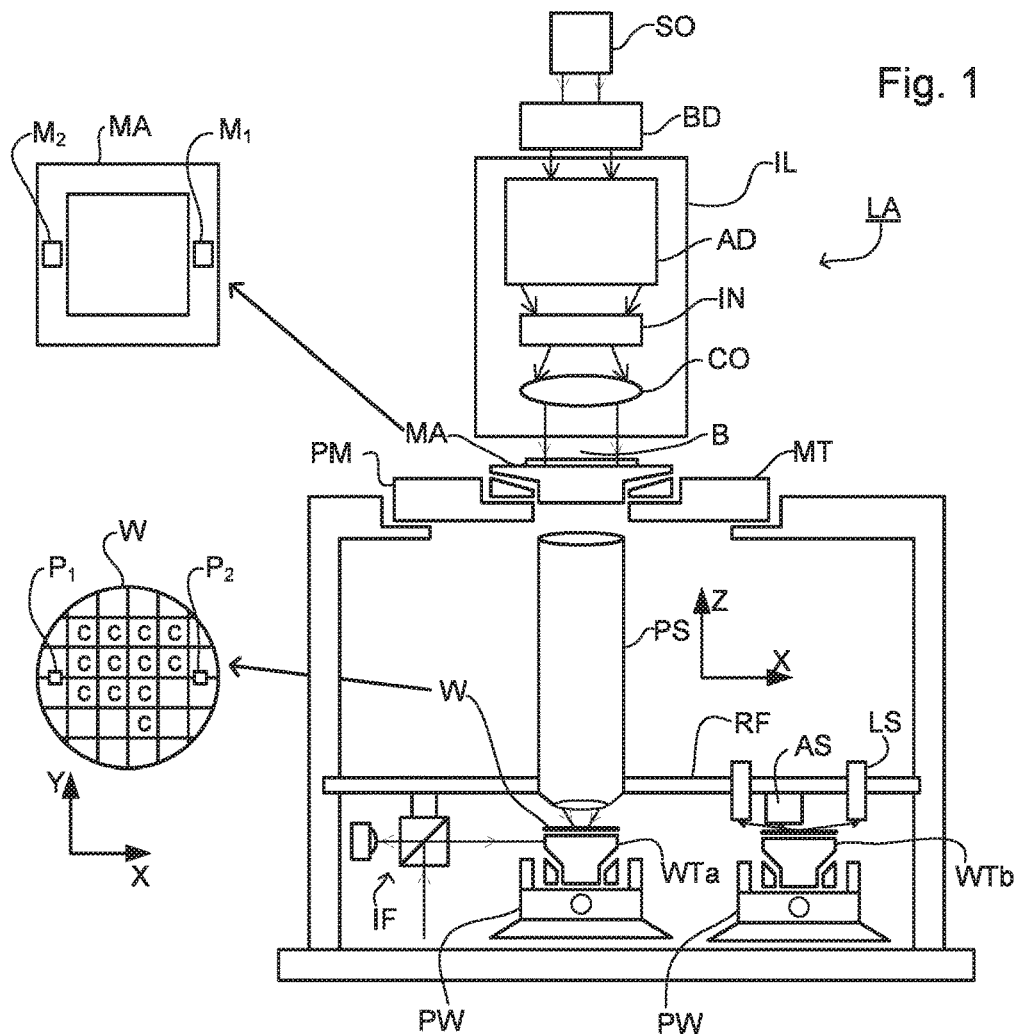
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing embodiments of the invention in detail, it is instructive to present an example environment in which embodiments of the present invention may be implemented.

FIG. 1 schematically depicts a lithographic apparatus LA. The apparatus includes an illumination system (illuminator) IL configured to condition a radiation beam. B (e.g., UV radiation or DIN radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator If may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
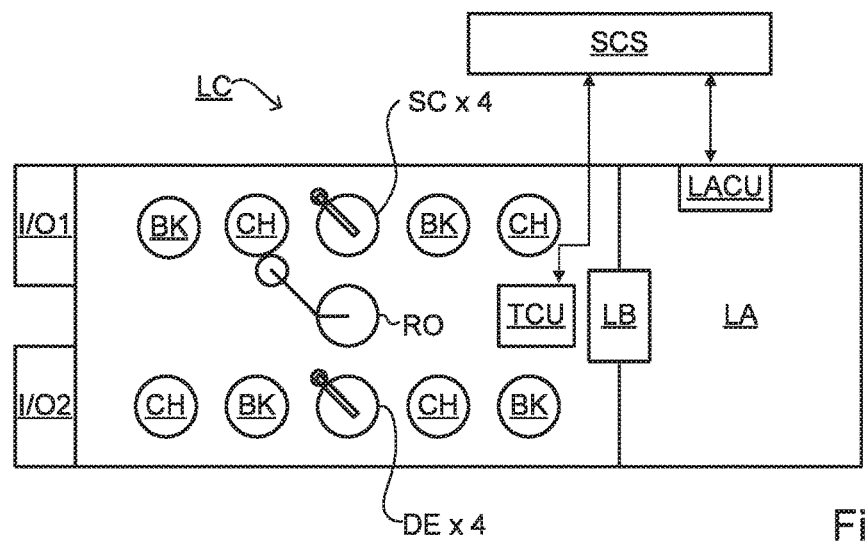
FIG. 2 depicts a lithographic cell or cluster according to an embodiment of the invention.

As shown in FIG. 2, the lithographic apparatus LA forms part of a lithographic cell LC, also sometimes referred to a lithocell or cluster, which also includes apparatus to perform pre- and post-exposure processes on a substrate. These include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Figure 3A:
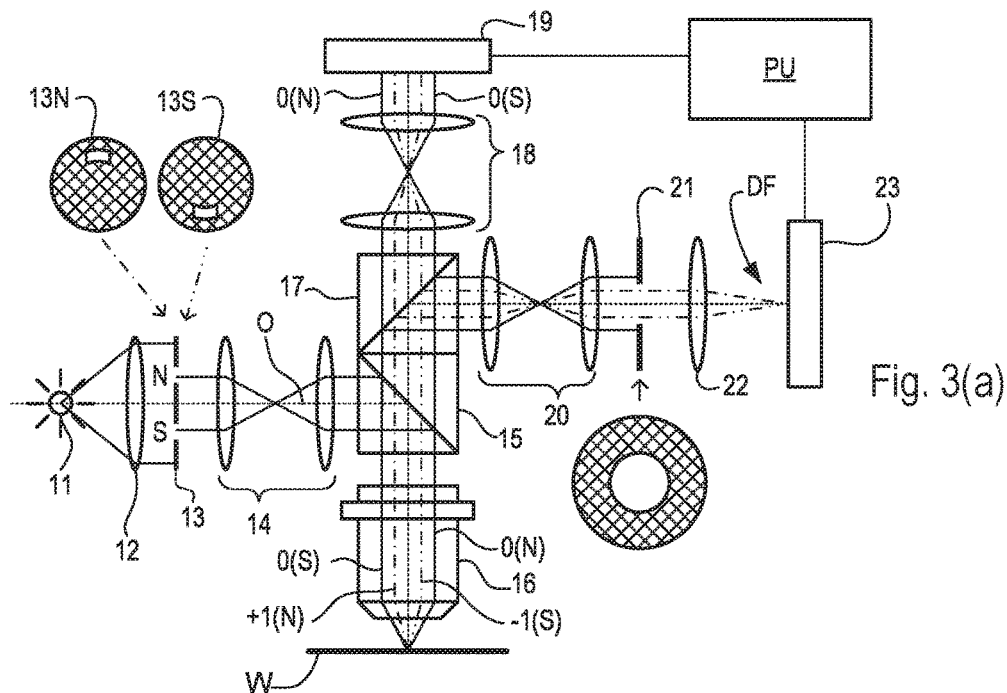
FIGS. 3(a) to 3(d) comprises 3(a) a schematic diagram of a dark field scatterometer for use in measuring targets according to embodiments of the invention using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures.

A micro diffraction based overlay (μDBO) metrology apparatus suitable for use in embodiments of the invention is shown in FIG. 3(a). A target grating T and diffracted rays are illustrated in more detail in FIG. 3(b). The μDBO metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses may be arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Figures 3B, 3C, 3D:
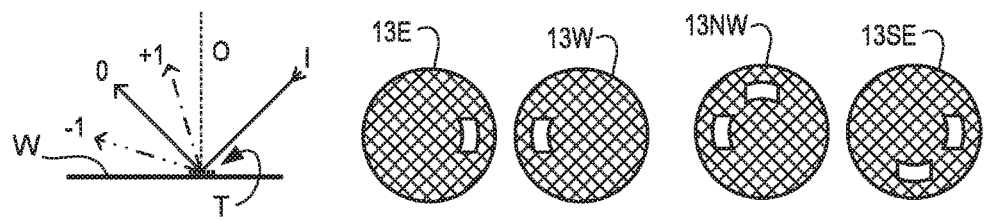

As shown in FIG. 3(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 3(a) and 3(b) are shown off axis, purely to enable them to be more easily distinguished in the diagram.

At least the 0 and +1 orders diffracted by the target on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not the subject of the present disclosure.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement methods, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop. Different aperture plates are shown in FIGS. 3(c) and (d) which can be used as described further below.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. More conveniently, however, illumination from east or west is provided in the illumination optics, using the aperture plate 13E or 13W, shown in FIG. 3(c). The aperture plates 13N to 13W can be separately formed and interchanged, or they may be a single aperture plate which can be rotated by 90, 180 or 270 degrees. As mentioned already, the off-axis apertures illustrated in FIG. 3(c) could be provided in field stop 21 instead of in illumination aperture plate 13. In that case, the illumination would be on axis.

FIG. 3(d) shows a third pair of aperture plates that can be used to combine the illumination modes of the first and second pairs. Aperture plate 13NW has apertures at north and east, while aperture plate 13SE has apertures at south and west. Provided that cross-talk between these different diffraction signals is not too great, measurements of both X and Y gratings can be performed without changing the illumination mode.

Figure 4:
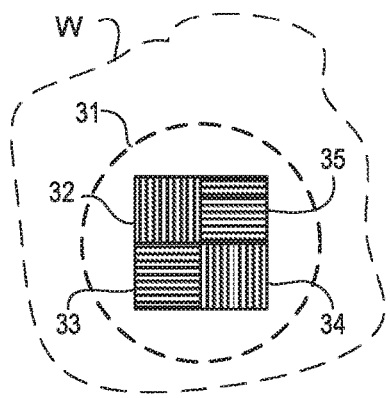
FIG. 4 depicts a known form of multiple grating target and an outline of a measurement spot on a substrate.

FIG. 4 depicts a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. In an example dedicated to overlay measurement, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. Gratings 32 to 35 may also differ in their orientation, as shown, so as to diffract incoming radiation in X and Y directions. In one example, gratings 32 and 34 are X-direction gratings with biases of the +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. While four gratings are illustrated, another embodiment might require a larger matrix to obtain the desired accuracy. For example, a 3×3 array of nine composite gratings may have biases −4d, −3d, −2d, −d, 0, +d, +2d, +3d, +4d. Separate images of these gratings can be identified in the image captured by sensor 23.

Figure 5:
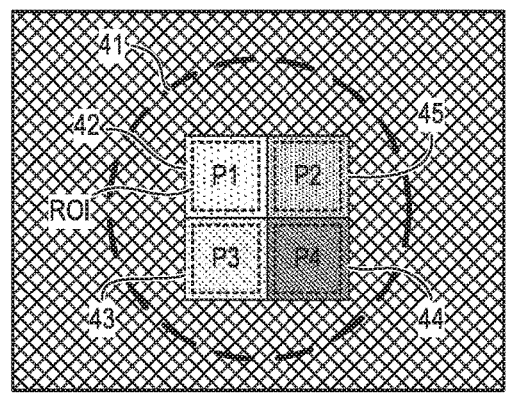
FIG. 5 depicts an image of the target of FIG. 4 obtained in the scatterometer of FIG. 3.

FIG. 5 shows an example of an image that may be formed on and detected by the sensor 23, using the target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the invention, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter, and is a measure of the lateral alignment of two lithographic layers. Overlay can be defined more specifically, for example, as the lateral position difference between the center of the top of a bottom grating and the center of the bottom of a corresponding top-grating.

Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120123581. The contents of all these applications are also incorporated herein by reference.

Figure 6:
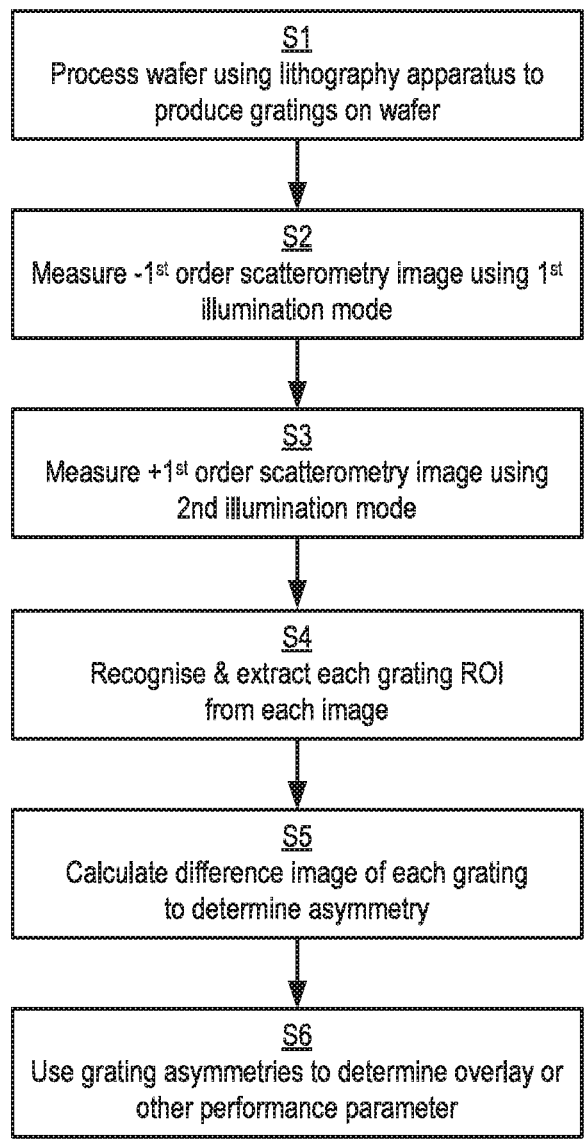
FIG. 6 is a flowchart showing the steps of an overlay measurement method using the scatterometer of FIG. 3 and adaptable to form an embodiment of the present invention.

FIG. 6 illustrates how, using for example the method described in application WO 2011/012624, overlay error between the two layers containing the component gratings 32 to 35 is measured through asymmetry of the gratings, as revealed by comparing their intensities in the +1 order and −1 order dark field images. At step S1, the substrate, for example a semiconductor wafer, is processed through the lithographic cell of FIG. 2 one or more times, to create a structure including the overlay targets 32-35. At S2, using the metrology apparatus of FIG. 3, an image of the gratings 32 to 35 is obtained using only one of the first order diffracted beams (say −1). Then, whether by changing the illumination mode, or changing the imaging mode, or by rotating substrate W by 180° in the field of view of the metrology apparatus, a second image of the gratings using the other first order diffracted beam (+1) can be obtained (step S3). Consequently the +1 diffracted radiation is captured in the second image.

Note that, by including only half of the first order diffracted radiation in each image, the 'images' referred to here are not conventional dark field microscopy images. The individual grating lines will not be resolved. Each grating will be represented simply by an area of a certain intensity level. In step S4, a region of interest (ROI) is carefully identified within the image of each component grating, from which intensity levels will be measured. This is done because, particularly around the edges of the individual grating images, intensity values can be highly dependent on process variables such as resist thickness, composition, line shape, as well as edge effects generally.

Having identified the ROI for each individual grating and measured its intensity, the asymmetry of the grating structure, and hence overlay error, can then be determined. This is done by the image processor and controller PU in step S5 comparing the intensity values obtained for +1 and −1 orders for each grating 32-35 to identify any difference in their intensity, and (S6) from knowledge of the overlay biases of the gratings to determine overlay error in the vicinity of the target T.

In the prior applications, mentioned above, various techniques are disclosed for improving the quality of overlay measurements using the basic method mentioned above. For example, the intensity differences between images may be attributable to differences in the optical paths used for the different measurements, and not purely asymmetry in the target. The illumination source 11 may be such that the intensity and/or phase of illumination spot 31 is not uniform. Corrections can the determined and applied to minimize such errors, by reference for example to the position of the target image in the image field of sensor 23. These techniques are explained in the prior applications, and will not be explained here in further detail. They may be used in combination with the techniques newly disclosed in the present application, which will now be described.

Overlay measurements according to this method assumes that the measured asymmetry is proportional only to the actual overlay shift between grating layers. However, this is not necessarily the case as the measured asymmetry is also affected by feature asymmetry effects that occur in production of the gratings. These feature asymmetry effects include side-wall angle asymmetry and floor-tilt, and perturb the first order asymmetry-based overlay measurement. This will result in a bias on the measurement, and therefore an inaccurate overlay measurement.

Figure 7:
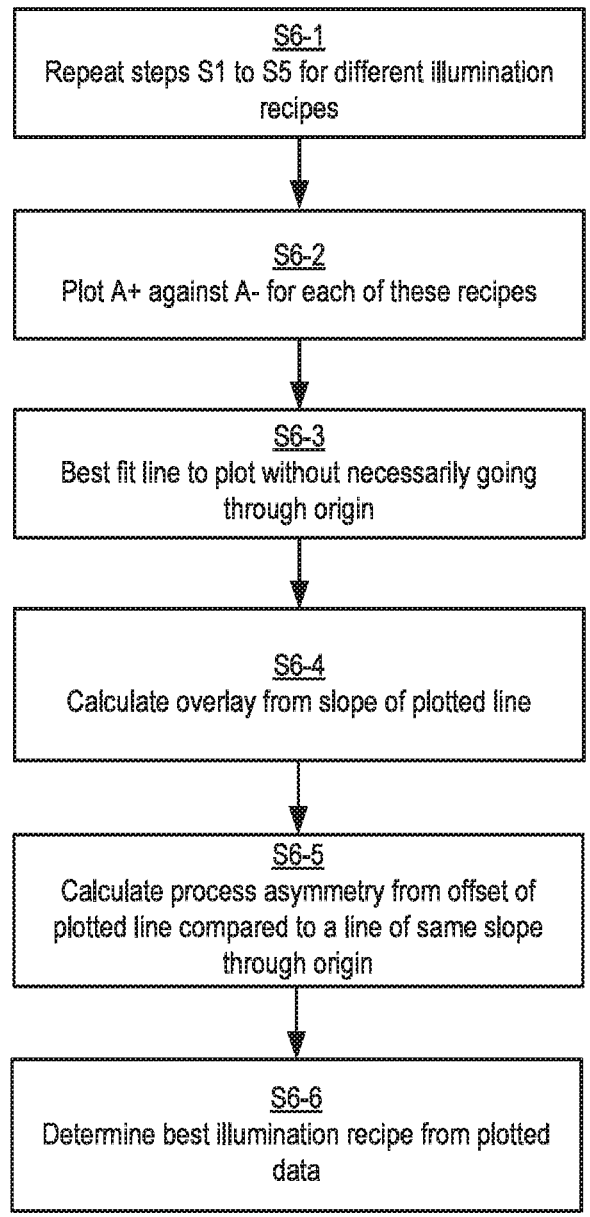
FIG. 7 is a flowchart expanding on step S6 of the flowchart of FIG. 6, in accordance with an embodiment of the invention.

FIG. 7 is a flowchart adapting step S6 of the flowchart of FIG. 6 to use an A+ versus A− regression to analyze diffraction-based overlay measurements (DBO and μDBO), by determining the asymmetry of the positively biased grating A+ as function of the asymmetry of the negatively biased grating A−. At step S6-1 A+ and A− is determined for a number or different measured pupil pixels and/or a number or different wavelength-polarization combinations (i.e. for a number of different illumination conditions or illumination "recipes"). Following this, at step S6-2, the determined values of A+ are plotted against the determined values of A− to yield the overlay.

Figure 8:
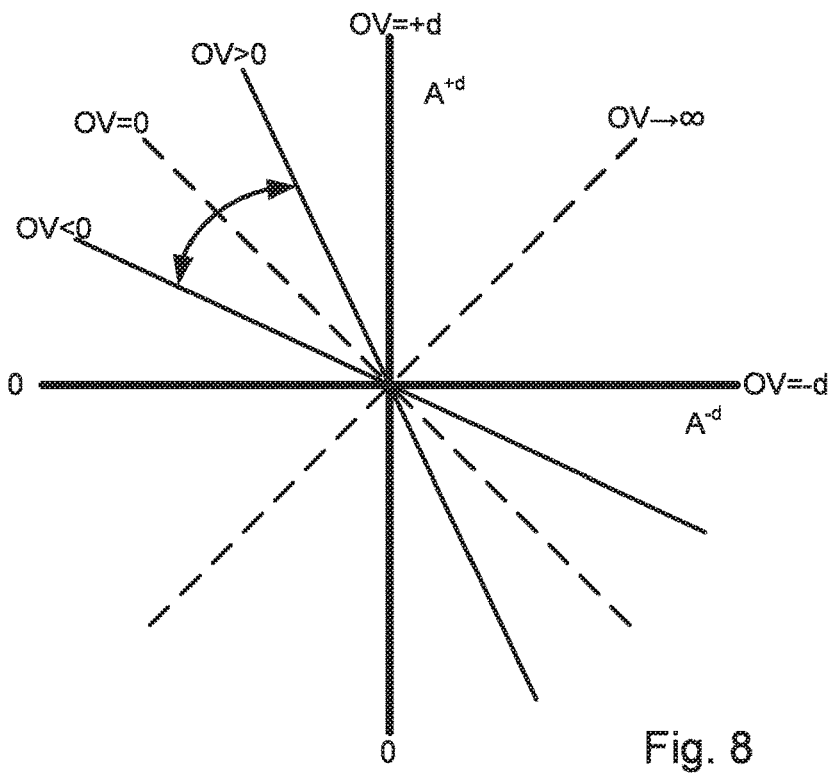
FIG. 8 is a plot of A+ against A− for overlay gratings that have no feature asymmetry.

FIG. 8 is a plot of A+ against A− for overlay gratings that have no feature asymmetry, such that the only asymmetry present is the asymmetry due to the bias and overlay. In this case, the relation between A+ and A− lies on a straight line through the origin. Remarkably, all measured wavelength-polarization combinations lie on this line.

The slope of this line is related to the overlay. The Figure shows four lines:

the dotted line labeled OV=0 is a line indicating zero overlay, having a slope of −1;

the dotted line labeled OV→∞ is a line having a slope of +1, indicative of overlay approaching infinity the solid line labeled OV<0 is a line having a slope less than −1 which indicates overlay less than zero; and the solid line labeled OV>A is a line having a slope greater than −1 which indicates overlay greater than zero;

Additionally, it can be seen that overlay equal to ±d, where d is the grating bias, would result in a plotted line along the y-axis; and overlay equal to −d would result in a plotted line along the x-axis.

It is proposed to use A+ versus A− regression to:

measure the correct overlay as it would be without a contribution attributable to feature asymmetry, by determination of the slope of a line fitted through the data set, the line not necessarily being fitted through the origin;

enable analysis of the feature asymmetry over the wafer via the offset of the line from the origin (i.e. from the intercept term);

perform illumination recipe-optimization by selection of the wavelength-polarization combination(s) that is(are) least sensitive to feature asymmetry.

Figure 9:
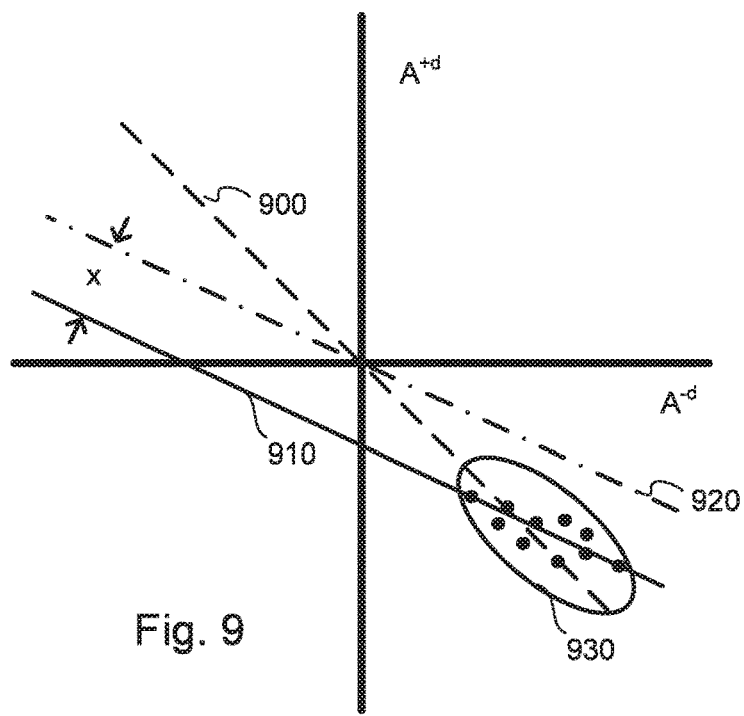
FIG. 9 is a plot of A+ against A− for overlay gratings having feature asymmetry, illustrating a first embodiment of the invention.

FIG. 9 is a plot of A+ against A− illustrating the first two of these aspects, such as may be plotted in step S6-2. According to the known method discussed above, data points 930 would be fitted with a line 900 through the origin. However, in this embodiment the data points are fitted according to a best fit method (for example, least squares) by a line 910 not necessarily going through the origin (step S6-3). In this way the overlay can still be calculated from the slope of the line 910 (step S6-4); it can be seen that line 910 is parallel to a line 920 indicative of that which would be seen for the same measured structure having no feature asymmetry. The axis intercept of line 910, that is the offset of line 910 from line 920 (a line having the same slope as line 910, but plotted through the origin) indicates quantitatively the effect of the feature asymmetry (step S6-5).

With d the overlay-bias of the two symmetrically biased gratings of the target and slope the slope of line 910, the overlay can be calculated from FIG. 9 as (with a linearized relation between the asymmetry and the overlay):

$$\text{overlay} = d \cdot \frac{\text{slope} + 1}{\text{slope} - 1} \quad \text{(equation 1)}$$

For a pitch-periodic sine-relation the overlay can similarly be understood as:

$$\text{overlay} = \frac{\text{pitch}}{2\pi} a\tan\left\{\frac{\text{slope}+1}{\text{slope}-1} \cdot \tan\left(\frac{2\pi \cdot d}{\text{pitch}}\right)\right\} \quad \text{(equation 2)}$$

where pitch is the grating pitch.

Figure 10A:
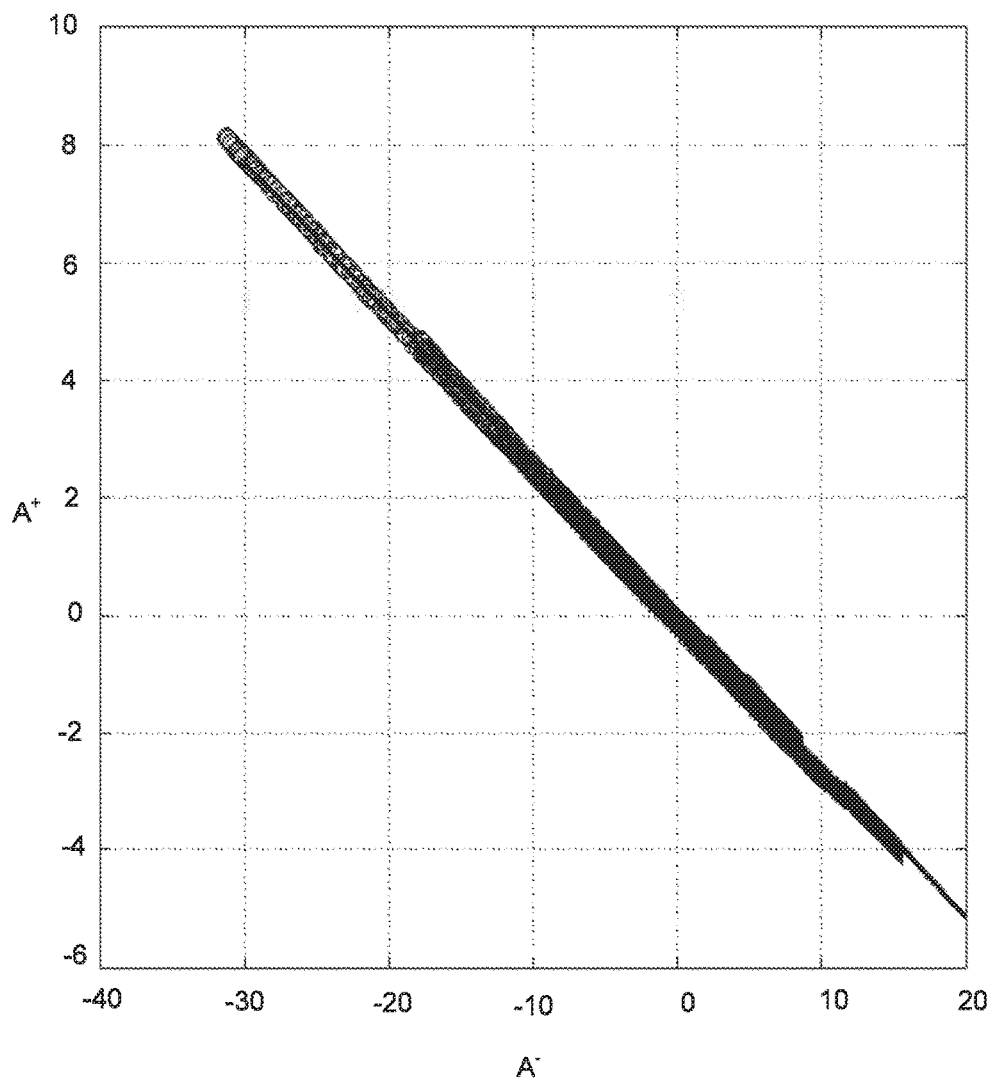
FIGS. 10a and 10b plot of A+ against A− for an overlay grating having no feature asymmetry and an overlay grating with feature asymmetry, illustrating a second embodiment of the invention.
Figure 10B:
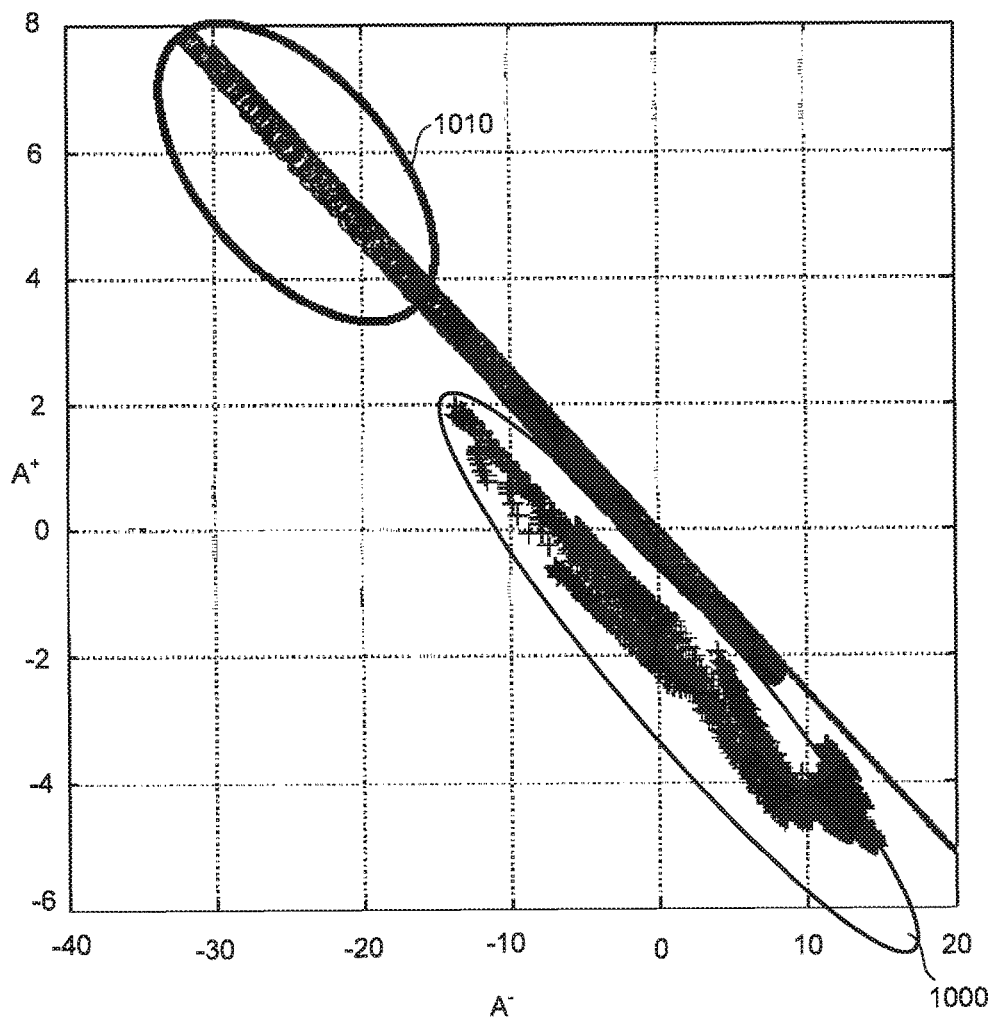

FIG. 10a is a plot of A+ against A− for (simulated) data of different polarization-wavelength combinations, for gratings having no feature asymmetry. It can be seen that all the data fits on the same line, as already discussed. FIG. 10b shows a similar plot as that of FIG. 10a, but with feature asymmetry present, specifically a 0.5 nm floor-tilt. In both cases data marked by a circle represents TE radiation and data marked by a cross represents TM radiation. Although it cannot be seen here, position along the line is largely determined by wavelength (for a given polarization) such that shorter (violet) wavelengths tend to be found at the upper end of the line (A+=6 to 8), and the longer (red) wavelengths tend to be found at the lower end of the line.

From FIG. 10b it can be seen that wavelength- and polarization-dependent deviation from the linear relationship is observed in the region 1000 around the origin. Overlay sensitivity, in this example of a 0.5 nm floor-tilt, is smallest for TE polarization. Furthermore, data with the largest K-value (the proportionality factor between overlay and asymmetry), i.e. the largest sensitivity to overlay, can also be easily identified, this being data 1010 which still shows a linear relationship farthest from the origin. The data 1010 in this example is for radiation in the short wavelength (violet) region. Consequently a plot such as this allows selection of an optimal illumination recipe (optional step S6-6) which when used to measure a grating, yields data 1010 most sensitive to overlay and least dependent on feature asymmetry.

In a practical overlay recipe optimization, a number of measurements over the wafer should be performed for different colors and polarizations, such that all possible feature asymmetries on the wafers (e.g. at the edge) are considered. Once the optimum recipe is selected, the measurements can be performed with this single wavelength-polarization-aperture combination.

If none of the single wavelength-polarization-aperture combinations are providing sufficient feature asymmetry robustness, it may be possible to identify a combination of 2 or 3 settings using this method combined with the A+ versus A− regression analysis explained above. This may be the case where each individual setting yields a cloud of data entries, and the line through 2 to 3 settings shows a non-zero axis cut-off; the slope of such a line would still yield relatively asymmetry robust overlay data. To do this, 2 or 3 settings are needed for the actual overlay measurements.

Figure 11:
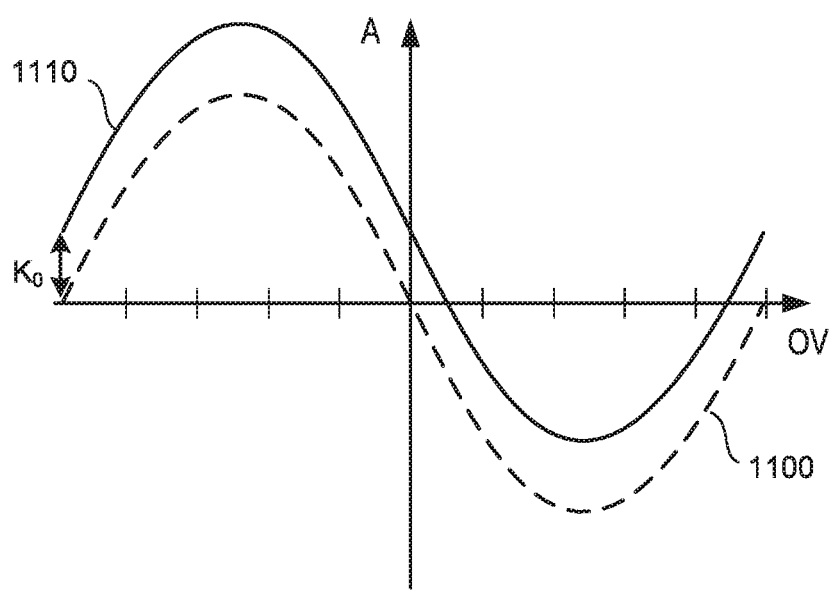
FIG. 11 is a plot of asymmetry against overlay for an overlay grating with feature asymmetry.

FIG. 11 shows that feature asymmetry results in a vertical offset K0 in the data plotted on a graph of asymmetry A versus overlay OV. Line 1100 fits data for a grating structure having no asymmetry, and line 1110 fits data for a grating structure having some asymmetry. It can be shown that A=K1 sin (OV).

Figure 12A:
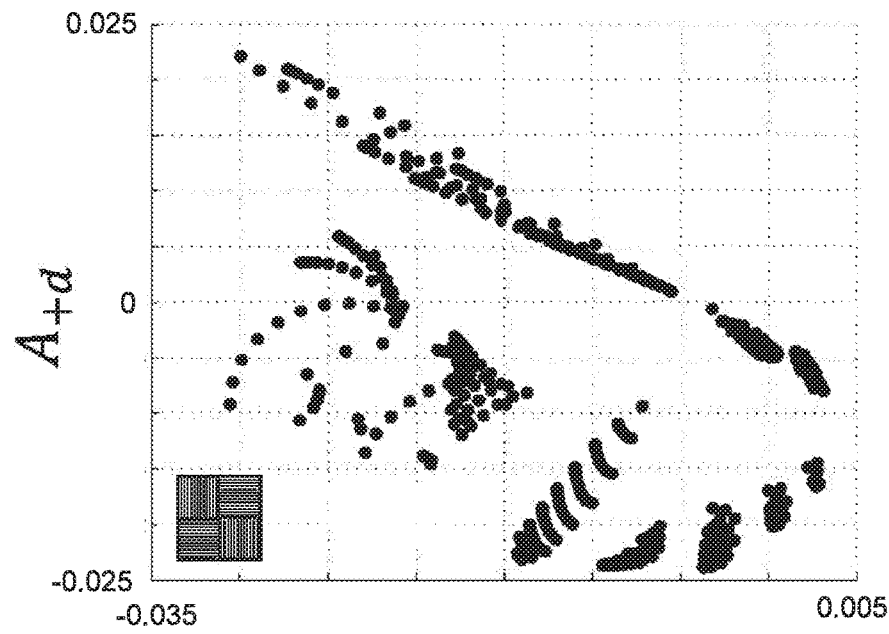
FIG. 12a is a plot of A+ against A− for overlay gratings that have large feature asymmetry.
Figure 12B:
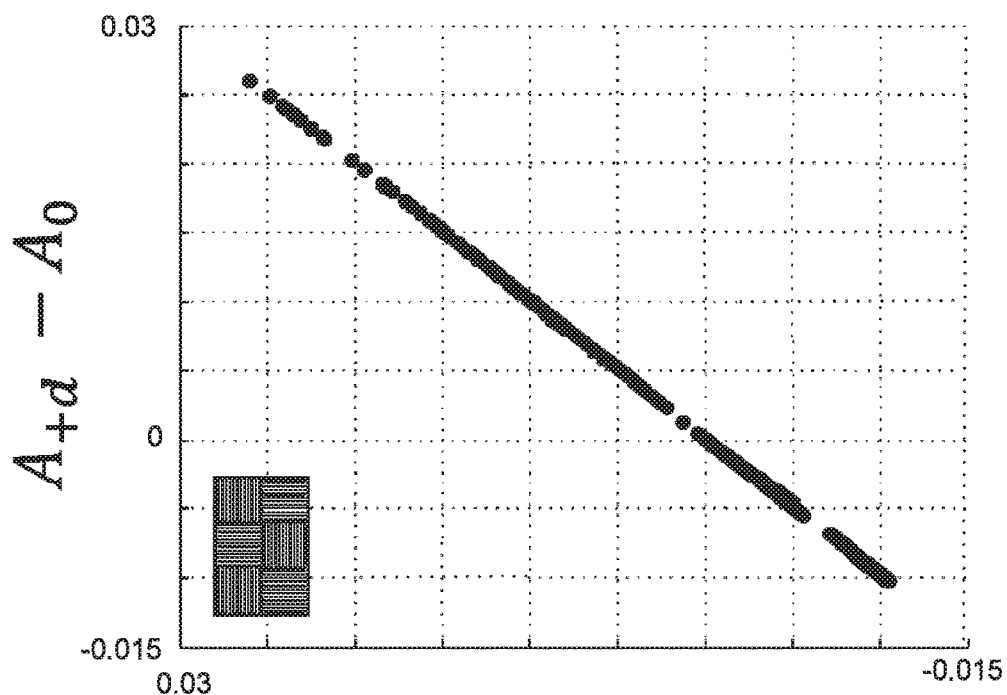
FIG. 12b is a plot of A+-A0 versus A--A0 for an overlay grating comprising a third bias and large feature asymmetry, illustrating a third embodiment of the invention.
Figure 14A:
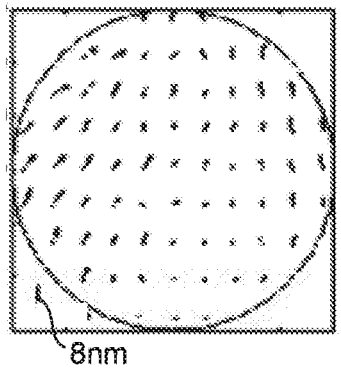
FIGS. 14(a)-14(f) are graphical representations of overlay on a wafer and illustrates that correcting for process asymmetry minimizes the difference between overlay estimated with TE and TM radiation
Figure 14D:
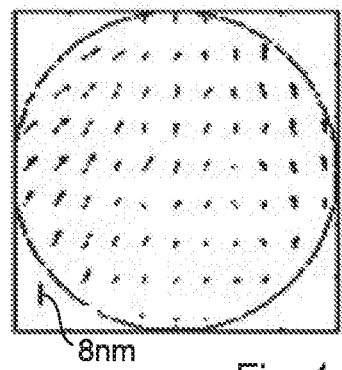
Figure 14B:
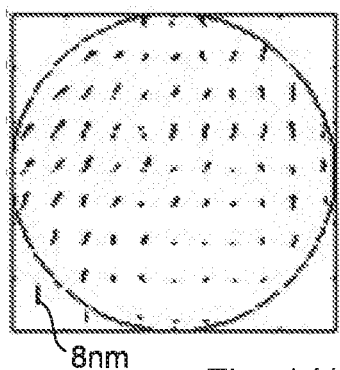
Figure 14E:
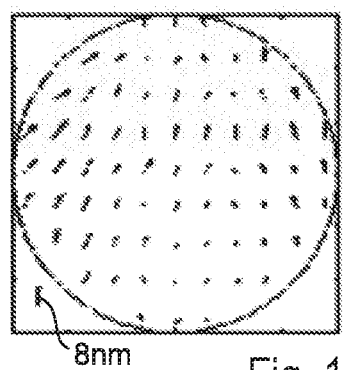
Figure 14C:
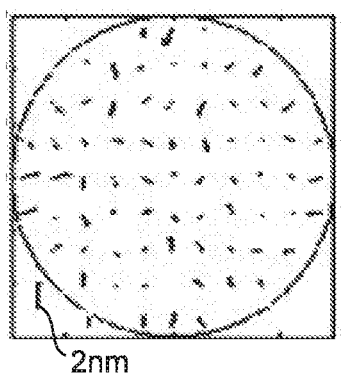
Figure 14F:
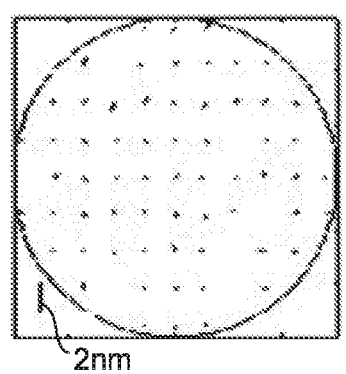

For very large feature asymmetries, the methods disclosed herein show significant deviations from a line. This is illustrated in FIG. 12a, which shows simulation data on an A+ versus A− plot for gratings having large feature asymmetry (note: K0 is constant over the pupil in this model). As can be seen the data points do not all lie on or close to a line, making fitting to the data very difficult.

To counter this, in addition to the above methods, a third grating (or grating pair) can be used, such that the grating structure comprises gratings having three different biases. In a specific embodiment, in addition to the +d and −d gratings, there is provided a grating without any bias. This enables the extraction of relative asymmetry, which can be plotted on a graph of A±-A0 versus A−-A0 (FIG. 11b), where A0 is the asymmetry of the zero-biased grating. It can be seen that the resultant data is much less sensitive to feature asymmetry (all data points lie essentially on the same line) which enables the extraction of the overlay even in the presence of a large feature asymmetry. It should be noted that K0 is allowed to vary over the pupil in this embodiment. Such measurements can be used to determine whether there is feature asymmetry is present in the stack. Using this method, the asymmetry A can be calculated as:

$$A = K0 + K1 \sin(OV).$$

This results in an error decrease, compared to the two-bias example, of:

$$\frac{2K_0 d}{A_{-d} - A_{+d}}$$

Figure 13:
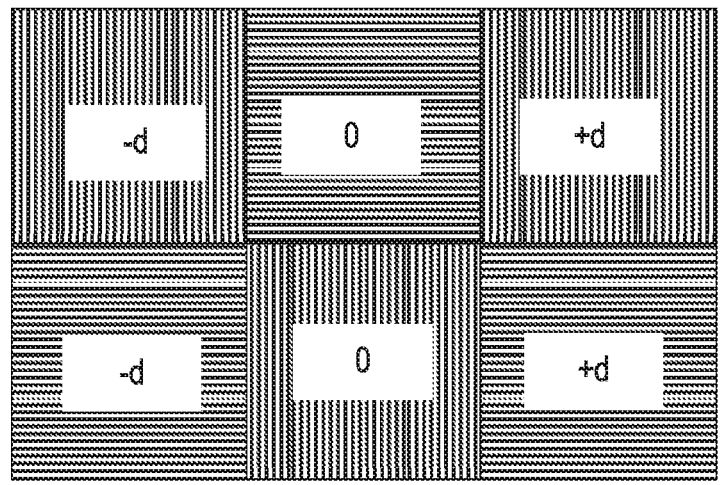
FIG. 13 illustrates a composite grating structure having a bias scheme that can be used in the third embodiment of the present invention.

A suitable grating structure for this method is illustrated in FIG. 13. It comprises two mutually perpendicular gratings having a negative bias −d, two mutually perpendicular gratings having a zero bias and two mutually perpendicular gratings having a positive bias ±d. Such a grating structure is directly applicable to small target design as used for μDBO targets.

This method can be combined with others described herein. For example, process-asymmetry sensitivity can be reduced by recipe optimization, experimentally selecting the least sensitive wavelength and polarization.

In summary, the overlay analysis- and recipe-selection method using the 1st bias asymmetry vs. 2nd bias asymmetry regression may comprise:

analysis of smallest 'pupil-sigma' (recipe setting that fits best on the line, e.g in least-squares sense);

analysis of the processing-asymmetry sensitivity (offset of this line with respect to the origin, or where there is no linear dependence);

a test of model-consistency over the pupil of the 'linear' and 'ATAN' model; and analysis of the processing asymmetry over the water.

In addition it should be noted that the proposed recipe selection and overlay analysis method does not require any stack information to perform.

For pupil-based analysis, the methods disclosed herein correctly include data points over which the K-value (proportionality factor between overlay and asymmetry) changes sign. This potentially extends the usable recipe-settings range for a good measurement, and enables (for example) selection based on other parameters such as linearity-range.

It has been disclosed above that overlay can be estimated from the slope of a regressed line 910 such as that show on FIG. 9. Feature asymmetry in the stack causes this regressed line to shift away from the origin. This shift in the regressed line effectively observes the feature asymmetry.

It is further proposed to correct the estimated overlay across the wafer by utilizing this measured asymmetry shift. Given wafer measurements, the covariance between the estimated overlay and the measured asymmetry shift clearly shows that there is a correlation between these two measurements over the wafer. Thus, it is proposed to correct the estimated overlay over the wafer as function of the measured asymmetry shift. To find the optimal correction, a minimization (for example a linear minimization such as least squares) can be set up which minimizes the difference between overlay estimated with TE polarized radiation and overlay estimated with TM polarized radiation.

Such a method may comprise the steps of:

Performing the method steps S6-1 to S6-5 at a number of locations on a wafer using both TE polarized radiation and TM polarized radiation (individually). As a result of these measurements, estimates for overlay (line slope) and process asymmetry (line offset) at each wafer location will be obtained, for both the TE polarized radiation and the TM polarized radiation.

Minimizing the difference between overlay estimated with TE polarized radiation and overlay estimated with TM polarized radiation estimated in the previous step so as to find a correction for the estimated overlay over the wafer as function of the measured process asymmetry.

FIG. 14 illustrates that making corrections for process asymmetry as described minimizes the difference between overlay estimated with TE and TM radiation. FIGS. 14(*a*) and 14(*b*) show representations of uncorrected overlay measurements performed over a wafer using, respectively, TE radiation and TM radiation. FIG. 14(*c*) is the difference between the measurements of FIGS. 14(*a*) and 14(*b*). FIGS. 14(*d*) and 14(*e*) show representations of overlay measurements performed over a wafer using, respectively, TE radiation and TM radiation; and that have been corrected in accordance with this embodiment. FIG. 14(*f*) is the difference between the measurements of FIGS. 14(*d*) and 14(*e*). It can be seen clearly that the difference between the TE overlay measurements and TM overlay measurements is smaller for the corrected overlay measurements than for the uncorrected overlay measurements.

By way of further evidence of the efficacy of this method, overlay was calculated independently across 3 separate data sets, corresponding to 3 separate wavelength TE/TM measurement pairs. The differences in the estimated overlay between these 3 sets were considered. It was observed that the RMS of the difference in overlay measured with separate wavelengths and polarizations was improved by 0.2 nm for both the x and y direction, resulting in a 70% improvement in accuracy.

Furthermore, it is remarked that the techniques disclosed herein can be applied to large scatterometer targets, also referred to as standard targets, Using the apparatus of FIG. 3, for example, the overlay in these larger targets can be measured by angle-resolved scatterometry using the pupil image sensor 19 instead of or in addition to measurements made in the dark-field imaging branch and sensor 23.

The targets in this proposal also allow for the standard overlay calculation methods that do not take the bottom grating asymmetry (BGA) into account ('linear'- and 'ATAN'-method), to be applied from the measurement.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified step S6 (including steps S6-1 to S6-6) and so calculate overlay error with reduced sensitivity to feature asymmetry. The program may optionally be arranged to control the optical system, substrate support and the like to perform the steps S2-S5 for measurement of asymmetry on a suitable plurality of target structures.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of measuring a parameter of a lithographic process, the method comprising:
    illuminating target structures on a substrate, the target structures comprising at least a first target structure comprising a first overlaid periodic structure having a first deliberate overlay bias and a second target structure comprising a second overlaid periodic structure having a second deliberate overlay bias;
    detecting radiation scattered by each target structure to obtain for each target structure an asymmetry measurement representing an overall asymmetry that includes contributions due to (i) the deliberate overlay bias in the target structure, (ii) an overlay error in the lithographic process during forming of the target structure and (iii) feature asymmetry within one or more of the periodic structures;
    repeating the illuminating and the detecting for a plurality of different illumination conditions to obtain asymmetry measurement data;
    performing a regression analysis on the asymmetry measurement data by fitting a linear regression model to a planar representation of asymmetry measurements for the first target structure against asymmetry measurements for the second target structure; and
    determining the overlay error from a slope described by the linear regression model,
    wherein the overlay error is measured for a plurality of different locations on the substrate using three data sets which correspond to three separate wavelength TE/TM measurement pairs.

2. The method according to claim 1, further comprising:
    determining the contribution of the overall asymmetry which is due to the feature asymmetry from an intercept term of the linear regression model;
    determining an overlay correction which is a function of the determined contribution of the overall asymmetry that is due to the feature asymmetry; and
    correcting the overlay error using the determined overlay correction.

3. The method according to claim 2, wherein the determining an overlay correction comprises:
    calculating the overlay correction by performing a minimization of a difference between measured overlay error when measured using TIE polarized radiation and measured overlay error when measured using TM polarized radiation.

4. The method according to claim 1, wherein the linear regression model fitted to the asymmetry measurements is fitted only to asymmetry measurement data lying in a region of an origin, and the method further comprising:
    identifying one or more optimal illumination conditions for which the feature asymmetry makes minimal contribution to the measured overall asymmetry, from the plurality of illumination conditions, the one or more optimal illumination conditions being selected from those for which the measured asymmetries lie on or near an offset line, the offset line being that described by the linear regression model but with zero intercept term such that it lies on the origin,
    wherein the one or more optimal illumination conditions are selected from those for which the measured asymmetries are furthest away from any measured asymmetries not lying on or near the offset line.

5. The method according to claim 4, further comprising:
    making subsequent measurements of target structures on the substrate using the one or more optimal illumination conditions.

6. The method according to claim 1, wherein the first deliberate overlay bias is a positive overlay bias and the second deliberate overlay bias is a negative overlay bias.

7. The method according to claim 6, wherein the first deliberate overlay bias and the second deliberate overlay bias are of equal magnitude.

8. The method according to claim 1, wherein the determining the overlay error is performed with an assumption that the contribution due to the feature asymmetry is constant for all values of overlay.

9. The method according to claim 1, wherein the target structures comprise a third target structure having no deliberate overlay bias, and the method further comprises:
    determining relative asymmetry measurements from a difference between asymmetry measurements obtained for the first target structure and the third target structure, and from a difference between asymmetry measurements obtained for the second target structure and the third target structure,
    wherein the determining the overlay error is performed without an assumption that the contribution due to the feature asymmetry is constant for all values of overlay.

10. The method according to claim 1, wherein the target structures comprise a third target structure having no deliberate overlay bias, and the method further comprises:
- determining relative asymmetry measurements from a difference between asymmetry measurements obtained for the first target structure and the third target structure, and from a difference between asymmetry measurements obtained for the second target structure and the third target structure;
- wherein the performing a regression analysis comprises fitting a linear regression model to a planar representation of the difference of the asymmetry measurements for the first target structure and the asymmetry measurements for the third target structure against the difference of the asymmetry measurements for the second target structure and the asymmetry measurements for the third target structure; and
- wherein the determining the overlay error is performed without an assumption that the contribution due to the feature asymmetry is constant for all values of overlay.

11. The method according to claim 1, further comprising: using the lithographic process to form the target structures on the substrate.

12. An inspection apparatus for measuring a parameter of a lithographic process, the apparatus comprising:
- a support for a substrate having target structures thereon, the target structures comprising at least a first target structure comprising a first overlaid periodic structure having a first deliberate overlay bias and a second target structure comprising a second overlaid periodic structure having a second deliberate overlay bias;
- an optical system configured to illuminate the target structures and detect radiation scattered by each target structure to obtain, for each target structure and for a plurality of different illumination conditions, an asymmetry measurement representing an overall asymmetry that includes contributions due to (i) the deliberate overlay bias in the target structure, (ii) an overlay error in the lithographic process during forming of the target structure and (iii) feature asymmetry within one or more of the periodic structures;
- a processor configured to:
  - perform a regression analysis on asymmetry measurement data by fitting a linear regression model to a planar representation of asymmetry measurements for the first target structure against asymmetry measurements for the second target structure; and
  - determine the overlay error from a slope described by the linear regression model,
  - wherein the overlay error is measured for a plurality of different locations on the substrate using three data sets which correspond to three separate wavelength TE/TM measurement pairs.

* * * * *

UNITED STATES PATENT AND TRADEMARK OFFICE
CERTIFICATE OF CORRECTION

PATENT NO. : 10,331,041 B2
APPLICATION NO. : 16/159884
DATED : June 25, 2019
INVENTOR(S) : Middlebrooks et al.

Page 1 of 1

It is certified that error appears in the above-identified patent and that said Letters Patent is hereby corrected as shown below:

In the Claims

In Column 20, Line 20, please replace "TIE polarized radiation" with --TE polarized radiation--.

Signed and Sealed this
Tenth Day of September, 2019

Andrei Iancu
*Director of the United States Patent and Trademark Office*